United States Patent [19]

Hatanaka et al.

[11] Patent Number: 4,857,751
[45] Date of Patent: Aug. 15, 1989

[54] PHOTOELECTRIC CONVERSION APPARATUS WITH SEPARATING ELECTRODES

[75] Inventors: Katsunori Hatanaka, Yokohama; Toshihiro Saika; Takayuki Ishii, both of Hiratsuka; Katsuhiko Yamada, Atsugi, all of Japan

[73] Assignee: Canon Kabushiki Kaisha, Tokyo, Japan

[21] Appl. No.: 209,583

[22] Filed: Jun. 22, 1988

[30] Foreign Application Priority Data

Jun. 26, 1987 [JP] Japan .............................. 62-160508

[51] Int. Cl.$^4$ .................. H01J 40/14; H04N 3/14
[52] U.S. Cl. .................. 250/578; 358/213.15
[58] Field of Search .................. 250/578, 211 J; 358/213.15, 213.22, 213.28, 212, 213.27, 294; 357/30 Q, 30 H

[56] References Cited

U.S. PATENT DOCUMENTS

| | | | |
|---|---|---|---|
| 4,145,721 | 3/1979 | Beaudouin et al. | 250/578 |
| 4,390,791 | 6/1983 | Hatanaka et al. | 250/578 |
| 4,419,696 | 12/1983 | Hamano et al. | 250/578 |
| 4,424,590 | 1/1984 | Ozawa | 250/578 |
| 4,660,089 | 4/1987 | Lee | 358/213.15 |
| 4,742,239 | 5/1988 | Nakagawa et al. | 250/578 |
| 4,788,445 | 11/1988 | Hatanaka et al. | 250/578 |

FOREIGN PATENT DOCUMENTS 2919114 11/1979 Fed. Rep. of Germany ... 357/30 H

Primary Examiner—David C. Nelms
Assistant Examiner—Michael Messinger
Attorney, Agent, or Firm—Fitzpatrick, Cella, Harper & Scinto

[57] ABSTRACT

A photoelectric conversion apparatus includes a plurality of one-dimensionally arranged photoelectric conversion elements, a plurality of common electrodes each for commonly connecting at least two of output individual electrodes of the plurality of photoelectric conversion elements, and separating electrodes respectively formed between the plurality of common electrodes so as to maintain potentials at a predetermined level. The number of intersections between the individual and separating electrodes are identical in the individual electrodes.

1 Claim, 4 Drawing Sheets

PHOTOELECTRIC CONVERSION APPARATUS WITH SEPARATING ELECTRODES

BACKGROUND OF THE INVENTION

1. Field of the Invention

The present invention relates to a photoelectric conversion apparatus used in a facsimile system, an image scanner, or the like.

2. Related Background Art

In recent years, an elongated line sensor including an optical system having a 1:1 magnification has been developed as a photoelectric conversion apparatus for a compact, high-performance system such as a facsimile system and an image reader. In a conventional line sensor of this type, signal processing ICs (Integrated Circuits) constituted by switching elements or the like are connected to photoelectric conversion elements arranged in an array, column-wise. However, the number of photoelectric conversion elements is 1728 is required for an A4 size when the photolectric conversion apparatus complies with the facsimile G3 standard. A large number of signal processing ICs are therefore required. For this reason, the number of mounting steps is increased, the manufacturing cost is increased, and sensor reliability is degraded. A matrix wiring pattern is employed to reduce the numbers of signal processing ICs and mounting steps.

FIG. 1 is an illustrative block diagram of a photoelectric conversion apparatus employing matrix wiring. Referring to FIG. 1, the photoelectric conversion apparatus includes a photoelectric conversion unit 31, a scanning unit 32, a signal processing unit 33, and a matrix wiring unit 34.

The apparatus further includes individual electrode wirings 35 and common electrode wirings 36.

In the photoelectric conversion apparatus having the above arrangement in FIG. 1, since a wiring of the common electrodes 36 runs along a longitudinal direction of a sensor substrate, a large electrostatic capacitance is present between the electrodes. For this reason, signal crosstalk undesirably occurs. In order to eliminate the above disadvantages, in a conventional photoelectric conversion apparatus, separating electrodes 37 are arranged between the common electrodes so as to reduce the electrostatic capacitance between the common electrodes and prevent signal crosstalk, as shown in FIG. 2.

Note that each hollow dot in FIG. 2 represents an intersection 38 between the corresponding separating electrode wirings and individual electrode wirings. FIG. 3 is an enlarged view of the matrix wiring unit in FIG. 2. The matrix wiring unit includes contact holes 39 for respectively connecting the separating electrodes to the common electrodes.

In the photoelectric conversion apparatus in FIG. 2, though signal crosstalk between the common electrodes can be prevented, signal variations undesirably occur.

More specifically, as shown in FIG. 2 the numbers of intersections 38 between the individual electrode wirings and separating electrode wirings vary in the individual electrodes. Since the electrostatic capacitance between the common electrode wirings 36 and ground 40 varies upon a wiring, large signal output variations occur. In order to solve the above problems, even if a correction capacitor is connected to each common electrode wiring 36, it is difficult to completely prevent signal output variations of each photoelectric conversion element because of nonuniformity of thickness distribution of insulating layers.

SUMMARY OF THE INVENTION

It is an object of the present invention to provide a photoelectric conversion apparatus which can solve the above problems of the conventional techniques and minimize signal variations. In order to achieve this object, according to an aspect of the present invention, there is provided a photoelectric conversion apparatus including a plurality of one-dimensionally arranged photoelectric conversion elements, a plurality of common electrode wirings each for commonly connecting at least two of output individual electrode wirings of the plurality of photoelectric conversion elements, and separating electrode wirings respectively formed between the plurality of common electrode wirings so as to maintain potentials at a predetermined level, wherein the numbers of intersections between the individual and separating electrode wirings are identical in the individual electrode wirings.

With the above arrangement, the number of intersections between the individual and separating electrode wirings are identical on the individual electrode wirings and these electrodes are arranged so that the intersections therebetween are uniformly distributed in the space, thereby realizing a photoelectric conversion apparatus for minimizing signal variations.

DETAILED DESCRIPTION OF THE PREFERRED EMBODIMENT

With reference to the drawings, the present invention is explained as follows.

Figure 4:
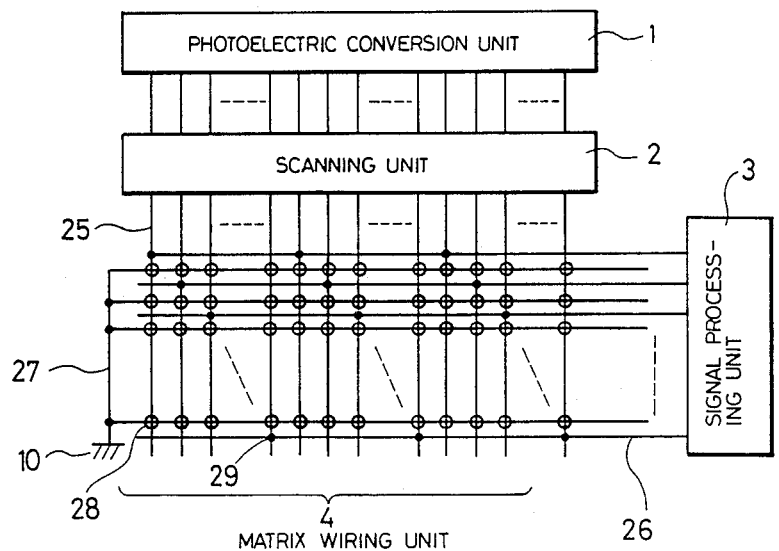
FIG. 4 is an illustrative block diagram of a photoelectric conversion apparatus according to the present invention.

FIG. 4 shows an illustrative block diagram of a photoelectric conversion device according to the present invention. As shown in FIG. 4, individual electrode wirings 25 have the same length. Common and separating electrodes wirings 26 and 27 also have the same lengths, respectively. The individual, common and separating electrode wirings 25, 26, and 27 constitute a matrix wiring. Each hollow dot 28 in FIG. 4 represents an intersection between the individual and separating electrode wirings 25 and 27. The numbers of intersections 28 are identical in the individual electrodes 25. A potential 10 of each separating electrode is normally kept at ground potential.

Figure 5A:
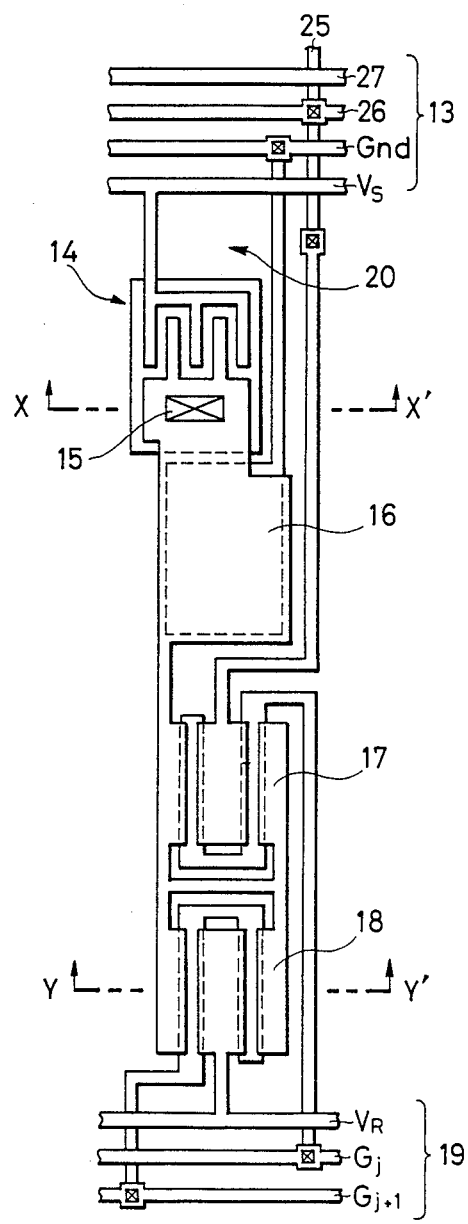
FIGS. 5A to 5C are illustrative views showing a photoelectric conversion apparatus of the present invention.
Figure 5B:
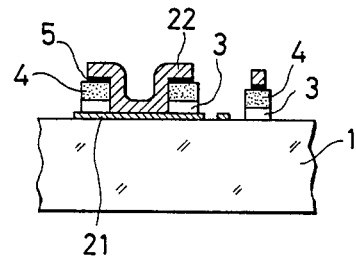
Figure 5C:
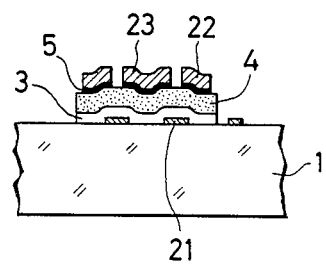

FIGS. 5A to 5C are illustrative views of a portion corresponding to one-bit of the photoelectric conversion apparatus of the present invention. FIG. 5A shows a plan view of it. FIG. 5B shows a cross sectional view along line X—X' in FIG. 5A. FIG. 5C shows a cross sectional view along line Y—Y' in FIG. 5A.

In order to simplify FIG. 5A, only upper and lower wiring patterns and contact hole portion are.

Referring to FIG. 5A, 13 denotes a signal line matrix unit. 14 denotes a photoelectric conversion unit. 15 denotes a hole for connection between gate and source. 16 denotes a capacitor. 17 denotes a transfer TFT. 18 denotes TFT for reset. 19 denotes a wiring portion of gate driving line. In the present embodiment, so called lensless structure wherein sensor unit directly contact an original to read it without using any imaging lens is used. Accordingly, a window 20 for illuminating the original is provided. The lower gate electrode of the sensor unit is formed by an opaque material, so that it serves as shielding film.

Figure 1:
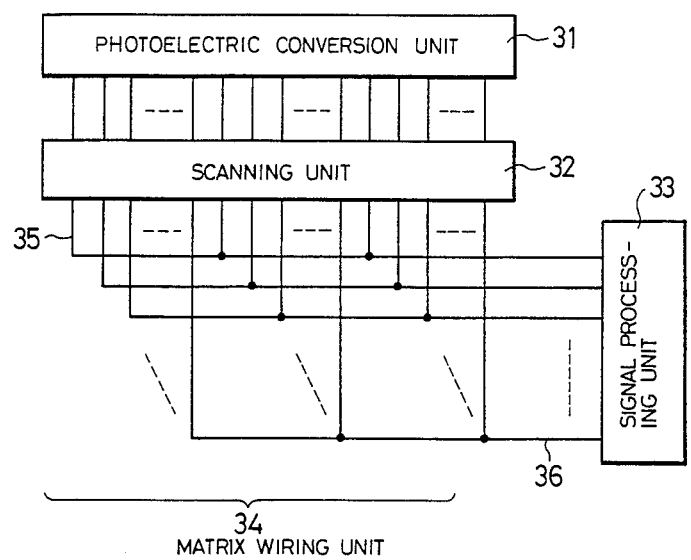
FIGS. 1 and 2 are illustrative block diagrams showing conventional photoelectric conversion apparatuses.
Figure 2:
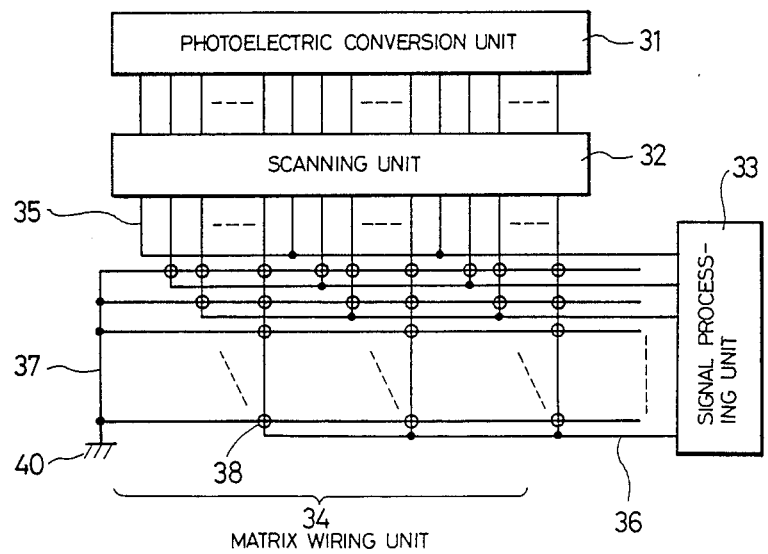
Figure 3:
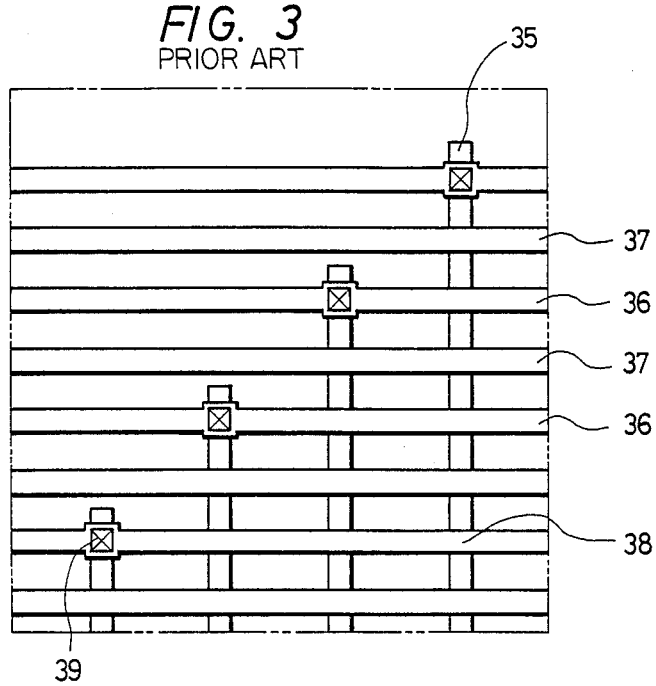
FIG. 3 is an enlarged view of a matrix wiring unit of the photoelectric conversion apparatus in FIG. 2.

Referring to FIGS. 5B and 5C, 1 denotes a substrate of glass or the like. Lower electrode 21 is a gate electrode of the sensor unit in FIG. 5B and of TFT in FIG. 5C.

Insulating layer 3 is made of $SiN_xH$, $SiO_2$ or the like.

N+ layer 4 is in ohmic contact with the upper electrodes 22 and 23. Electrode 22 is a source electrode of the sensor unit in FIG. 5B. Electrodes 22 and 23 are the source and drain electrodes of a TFT in FIG. 5C.

The photoelectric conversion device of the present invention is achieved by a stacked layer structure comprising lower electrode, SiNH insulating layer, a-Si:H layer, n+ layer and upper electrode to form TFT type photoelectric conversion unit, storage capacitor, transfer and reset TFT and matrix wiring unit on a common substrate simultaneously in a process.

Figure 6A:
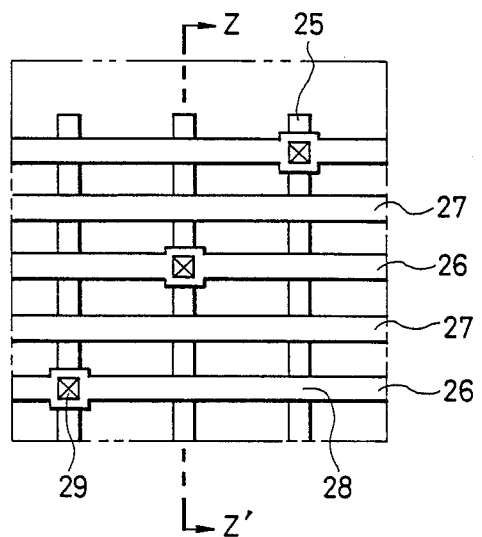
FIGS. 6A and 6B are partially enlarged views of a matrix wiring unit of the photoelectric conversion apparatus in FIG. 5A.
Figure 6B:
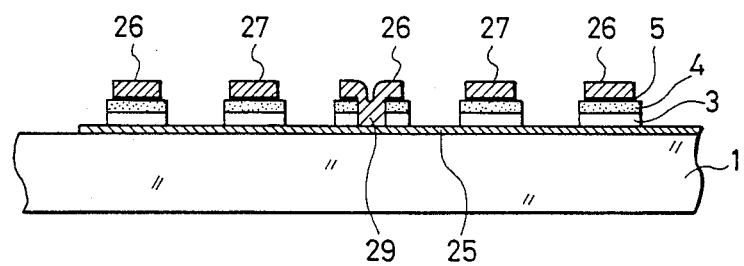

While, FIG. 6A shows an enlarged plan view of the signal line matrix portion in FIG. 5A, FIG. 6B shows a cross sectional view along line Z—Z' in FIG. 6A. In the matrix wiring portion, individual electrode wiring layer 25 and common electrode wiring layer 26 are arranged in a matrix via a-Si:H layer 4 and n+ layer 5. 29 denotes a contact portion of the individual electrode wiring 25 and the common electrode wiring 26.

Further, between respective common electrode wiring, separate electrode wiring 27 is formed. As described in the above, the number of intersection portion 28 of the individual electrode wiring 25 and the separate electrode wiring 27 is the same as that of the separate electrode.

According to the photoelectric conversion device of the present invention, the numbers of capacitances of the intersections 28 between the individual and separating electrode wirings 25 and 27 are identical in the individual electrode wirings 25. When capacitances of the common electrode wirings 26 are taken into consideration, the intersection 28 are uniformly distributed in a longitudinal direction of a photoelectric conversion element substrate. Therefore, even if the insulating film extends along the longitudinal direction of the substrate, the capacitance of each common electrode wirings 26 is kept to be a predetermined value and no signal variations occur.

As has been described above, according to the present invention, the individual and separating electrode wirings are arranged so that the numbers of intersections between the individual and separating electrode wirings are identical in the individual electrode wirings. Therefore, the photoelectric conversion apparatus according to the present invention has the following advantags:

(1) Capacitance variations of each common electrode wiring do not occur and uniformity of signal outputs can be improved; and (2) Since capacitances of the intersections are added to each other along the longitudinal direction of the photoelectric conversion apparatus substrate, the thickness distribution of the insulating layer and patterning errors do not adversely affect signal variations.

What is claimed is:

1. A photoelectric conversion apparatus comprising:
   a plurality of one-dimensionally arranged photoelectric conversion elements, each of said photoelectric conversion elements comprising an individual output electrode;
   a plurality of common electrodes each commonly connecting at least two of said individual output electrodes; and
   separating electrodes respectively formed between said common electrodes so as to maintain potentials at a predetermined level, wherein the number of intersections between said individual output electrodes and said separating electrodes is the same for each of said individual output electrodes.

* * * * *